United States Patent [19]
Baumert et al.

[11] Patent Number: 5,486,783
[45] Date of Patent: Jan. 23, 1996

[54] METHOD AND APPARATUS FOR PROVIDING CLOCK DE-SKEWING ON AN INTEGRATED CIRCUIT BOARD

[75] Inventors: Robert J. Baumert, Allentown; Robert L. Pritchett, East Allen Township, both of Pa.

[73] Assignee: AT&T Corp., Murray Hill, N.J.

[21] Appl. No.: 332,202

[22] Filed: Oct. 31, 1994

[51] Int. Cl.⁶ .................................................. H03L 7/06
[52] U.S. Cl. .................... 327/147; 327/149; 327/150; 327/158; 327/159; 327/244
[58] Field of Search ........................... 327/5, 12, 147, 327/149, 150, 158, 159, 244

[56] References Cited

U.S. PATENT DOCUMENTS

| | | | |
|---|---|---|---|
| 4,623,805 | 11/1986 | Flora et al. | 307/602 |
| 4,675,612 | 6/1987 | Adams et al. | 328/63 |
| 4,686,482 | 8/1987 | Zoetman et al. | 328/164 |
| 4,754,164 | 6/1988 | Flora et al. | 307/269 |
| 4,757,264 | 7/1988 | Lee et al. | 328/63 |
| 4,758,738 | 7/1988 | Yamanoi et al. | 307/269 |
| 4,825,109 | 4/1989 | Reynolds | 307/601 |
| 4,845,437 | 7/1989 | Mansur et al. | 328/15 |
| 4,931,986 | 6/1990 | Daniel et al. | 364/900 |
| 4,999,526 | 3/1991 | Dudley | 302/269 |
| 5,043,596 | 8/1991 | Masuda et al. | 307/262 |
| 5,073,730 | 12/1991 | Hoffman | 307/480 |
| 5,077,529 | 12/1991 | Goshai et al. | 328/158 |
| 5,079,519 | 1/1992 | Ashby et al. | 331/1 A |
| 5,081,655 | 1/1992 | Long | 375/119 |
| 5,097,489 | 3/1992 | Tucci | 375/120 |
| 5,101,117 | 3/1992 | Johnson et al. | 307/269 |
| 5,118,975 | 6/1992 | Hillis et al. | 327/5 |
| 5,120,990 | 6/1992 | Koker | 307/269 |
| 5,122,679 | 6/1992 | Ishii et al. | 327/149 |
| 5,144,170 | 9/1992 | Parker | 307/528 |
| 5,173,617 | 12/1992 | Alsup et al. | 307/269 |
| 5,184,027 | 2/1993 | Masuda et al. | 327/149 |
| 5,223,755 | 6/1993 | Richley | 327/12 |
| 5,245,637 | 9/1993 | Gersbach et al. | 375/119 |
| 5,298,866 | 3/1994 | Kaplinsky | 328/158 |
| 5,307,381 | 4/1994 | Ahuja | 375/107 |

OTHER PUBLICATIONS

"Normalization of Apparent Propagation Delay" R. J. Baumert et al., filed Aug. 15, 1994, U.S. Application Ser. No. 08/290,170, pp. 1–19, 7 sheets of drawings.
"ATTDA400 Programmable 100 MHz Clock Distribution IC" AT&T Microelectronics Brochure 1–11.
"Multimedia is Testing Designers" Savvy, Electronic Engineering Times Article, Reader Service No. 44, Nov. 1, 1993.

*Primary Examiner*—Margaret Rose Wambach

[57] ABSTRACT

The present invention relates to a circuit board having a plurality of integrated circuits provided thereon, wherein each integrated circuit (IC) receives a common clocked input reference signal and outputs a dam signal. Each integrated circuit is provided with a de-skewing circuit which compensates for signal delays in the IC so as to synchronize the output data signal with the clocked input reference signal. The de-skewing circuit is operative to generate a simulated signal delay to the input signal which emulates the signal delays of the IC.

13 Claims, 3 Drawing Sheets

METHOD AND APPARATUS FOR PROVIDING CLOCK DE-SKEWING ON AN INTEGRATED CIRCUIT BOARD

BACKGROUND OF THE INVENTION

1. Field of the Invention

The present invention relates generally to data processing systems and more particularly to an apparatus and method for overcoming the deleterious effects of clock skewing in a synchronous data processing system employing a plurality of integrated circuits.

2. Description of the Related Art

Virtually every circuit designed in modern electronic systems involves some kind of data transfer between multiple integrated circuit (IC) chips, often located on separate printing circuit boards. For digital systems, the data is typically transferred at the transitions of a clock signal from a register or flip flop in a sending IC to a similar device on a receiving IC. For error free transmissions, the clock signals appearing at each register should operate in-phase.

A particular problem which is caused by propagation time variations in a synchronous data processing system occurs in connection with the propagation of a clocked signal in a system having a multiple number of IC's. For example, propagation time variations (clock skewing) of an input clocked signal can produce significant skewing of clocked data signal when such a clocked data signal is applied to different IC's of the system relative to the systems clock reference signal. As system cycle time decreases relative to the time associated with clock skew, the clock skew can become an non-insignificant portion of the cycle time which may require a system to increase the overall cycle time to compensate for the clock skew overhead. However, in today's high performance systems (either computers or other systems designed using digital service), increasing the system cycle time can have a significant deleterious effect on system speed.

A principle cause of clock signal skew in a data processing system is effected by signal propagation time variations which result from the employment of multiple IC's in a system, wherein each IC causes different signal delays due to differing manufacturing process tolerances relative to one another. This is a particularly sensitive problem in the case of clock distribution circuitry.

One solution to this skew problem is to improve chip fabrication processes so as to make chips more uniform so that tolerances from chip-to-chip are smaller. However, the increased cost that would be involved makes this solution economically impractical.

Hence, there exists a need to reduce clock skew in a data processing system which results from the deleterious effects of propagation time variations inherent in an integrated circuit.

SUMMARY OF THE INVENTION

The present invention relates to a circuit board having a plurality of integrated circuits provided thereon, wherein each of the plurality of integrated circuits receives a common clock input reference signal and provides an output data signal therefrom. Each of the aforementioned integrated circuits includes compensating circuitry for synchronizing the data output signal with the clock input reference signal.

The compensating circuitry of each integrated circuit includes input buffering means for receiving and buffering the clock input reference signal, wherein the input buffering means generates a first signal delay to the input reference signal. Signal regulating means are coupled to the output of the input buffering means for providing a synchronizing signal delay to the input signal so as to synchronize the output data signal with the clocked input reference signal. The signal regulating means further includes an output port and at least one input port wherein a feedback loop couples the output port to the at least one input port. Clock driving means are coupled to the output port of the signal regulating means for driving the input signal to a plurality of logic devices associated with the integrated circuit. Output latching means are coupled to the output of the clocked driving means at a first input of the output latching means for latching the output data signal, wherein the output latching means generates a second signal delay upon the output data signal. Output buffering means are coupled to the output latching means for buffering the output data signal, wherein the output buffering means generates a third signal delay upon the output data signal.

The compensating circuitry of the present invention further includes simulated signal delay means coupled in the feedback loop of the signal regulating means for generating a delayed input signal to an input port of the signal regulating means with the simulated signal delay having a generated simulated signal delay which is approximately equal to the first signal delay of the input buffering means, a second signal delay of the output latching means and the third signal delay of the buffering means to the output signal of the clock driving means. The delayed input signal is operative to enable the signal regulating means to provide a signal delay to the clocked input reference signal so as to synchronize the output data signal with the clocked input reference signal.

In the preferred embodiment, the signal regulating means preferably includes phase detecting circuitry for measuring the signal phase difference between the output signal of the buffering means and the output signal of the simulated signal delay means having the generated simulated signal delay. The signal regulating means further includes regulated delay circuitry coupled to the phase detecting means for generating the synchronizing delay signal in response to the measured signal phase difference between the output signal of the input buffering means and the output signal of the clock driving means.

BRIEF DESCRIPTION OF THE DRAWINGS

The foregoing features of the present invention will become more readily apparent and may be understood by referring to the following detailed description of an illustrative embodiment of an apparatus according to the present invention, taken in conjunction with the accompanying drawings, in which.

DETAILED DESCRIPTION OF THE PREFERRED EMBODIMENTS

Figure 1:
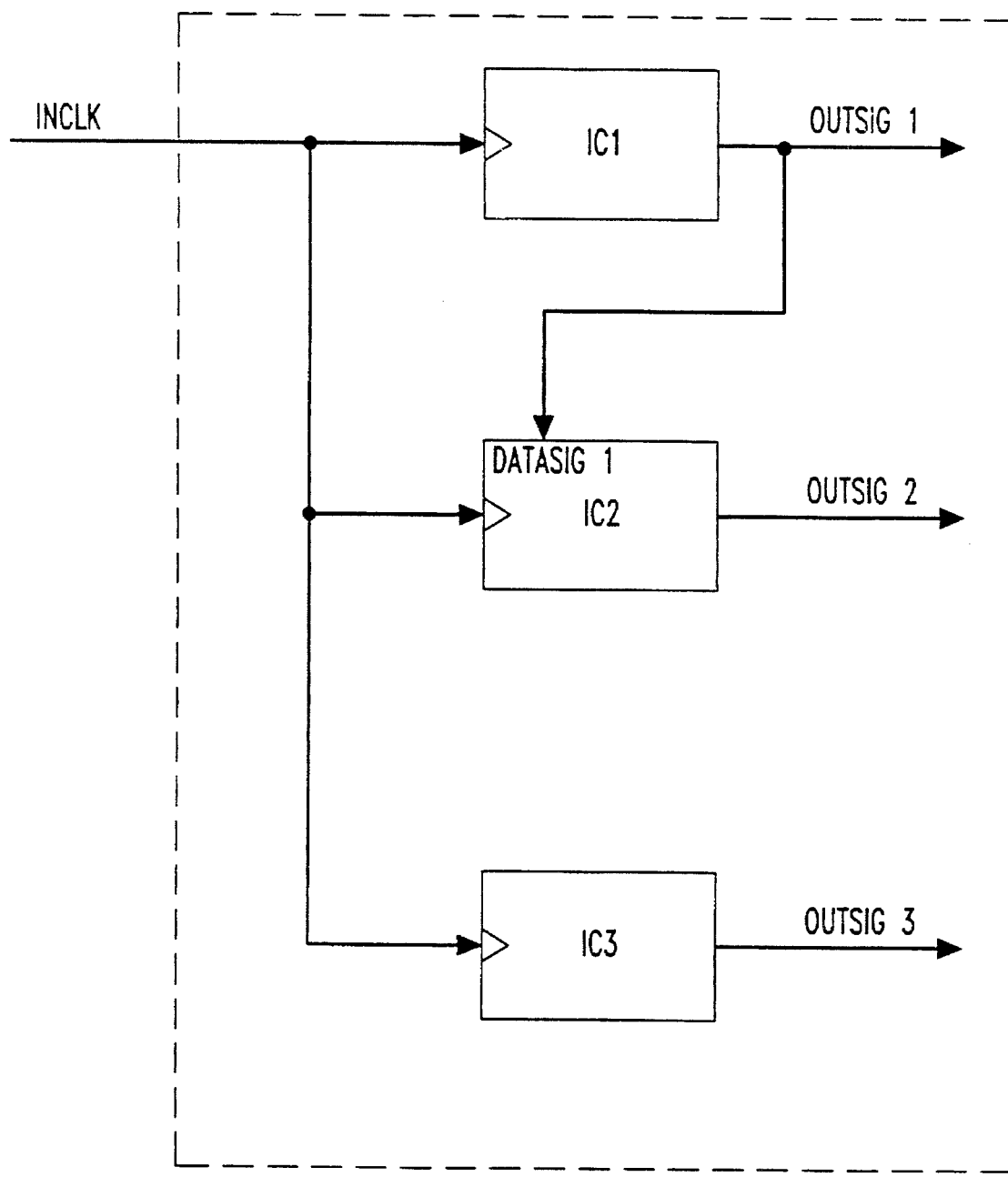
FIG. 1 is a simplified block diagram of a circuit board employing a multiplicity of integrated circuits wherein each individual integrated circuit employs the de-skewing circuit in accordance with the present invention.

Referring now to the drawings, in which like reference numerals identify similar or identical elements. FIG. 1 illustrates a circuit board designated generally by reference numeral 10 which is an intended environment for implementation of the present invention. Circuit board 10 preferably includes a plurality of integrated circuits (IC's) IC1 through ICN for performing data processing related functions. Each IC1 through ICN is provided with a common input clock signal INCLK to enable timed logic operation of IC1 through ICN, as is well known. The input clock signal INCLK serves as the timing reference for each IC1 through ICN. Preferably, the INCLK clock signal is generated from external clock circuitry which typically comprises a crystal oscillator or any other source which can generate a clock pulse with a desired degree of accuracy. Further, each respective IC generates an output dam signal (OUTSIG) which is preferably coupled to at least one other IC so as to provide a data input signal (DATASIG) thereto. As will be described further below, and in accordance with the present invention, each OUTSIG (OUTSIG1 thru OUTSIGN) are to have edge transitions which are substantially equal in time with the edge transitions of the INCLK clock signal.

In furtherance of circuit efficiency and accuracy, it is highly desirable that the respective output data signal OUTSIG1 through OUTSIGN of respectively IC1 through ICN be in synchronization with one another and with the common input clock reference signal INCLK. Thus, any clock-skew present in IC1 through ICN must be compensated for so as to enable the aforementioned synchronization of each respective data signal OUTSIG1 through OUTSIGN.

The present invention, as will be described hereinbelow, provides a de-skewing circuit in each IC1 through ICN, wherein each respective de-skewing circuit is configured to compensate for clock-skew of the INCLK signal in each IC1 through ICN. Further, it is to be noted that circuit board 10 is only a preferred embodiment for the implementation of the present invention de-skewing circuit and is not to be limited thereto, as it is to be appreciated that the present invention may be implemented in any circuitry utilizing a reference clock signal wherein clock-skew is of concern.

Figure 2:
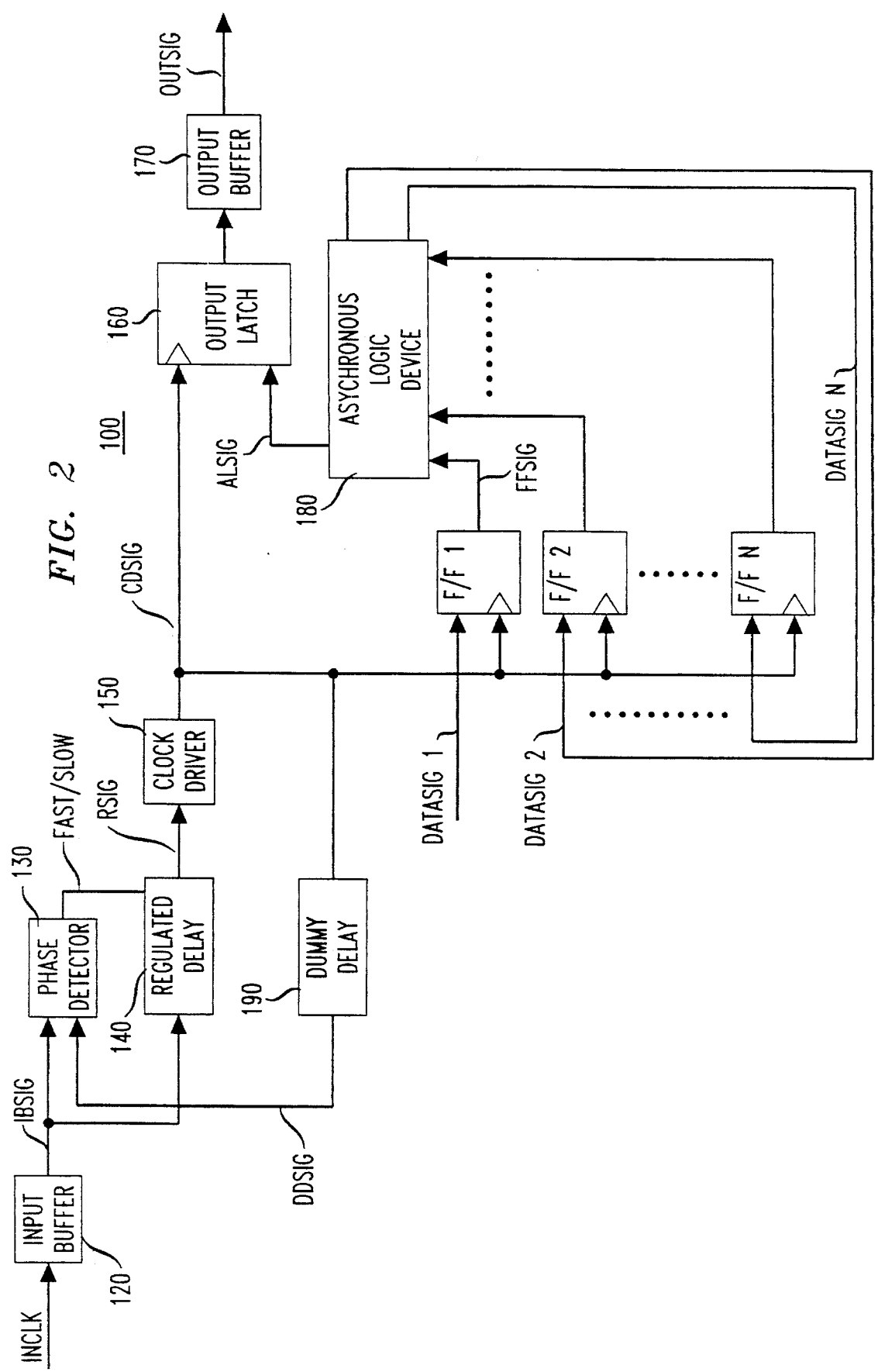
FIG. 2 is a schematic block diagram of the de-skewing circuit of the present invention which is employed in each individual integrated circuit illustrated in FIG. 1.

Referring now to FIG. 2, in conjunction with FIG. 1, there is illustrated a block diagram of a de-skewing circuit adapted to eliminate clock skew of the input signal INCLK due to buffer overhead in a multi-chip integrated circuit environment, the de-skewing circuit being designated generally by reference numeral 100. In particular, each IC1 through ICN of FIG. 1 is provided with the de-skewing 100, however, for simplicity only the de-skewing circuit 100 of IC1 is depicted in FIG. 2, as identical de-skewing circuits thereto are to be preferably provided in each IC1 through ICN.

Figure 3:
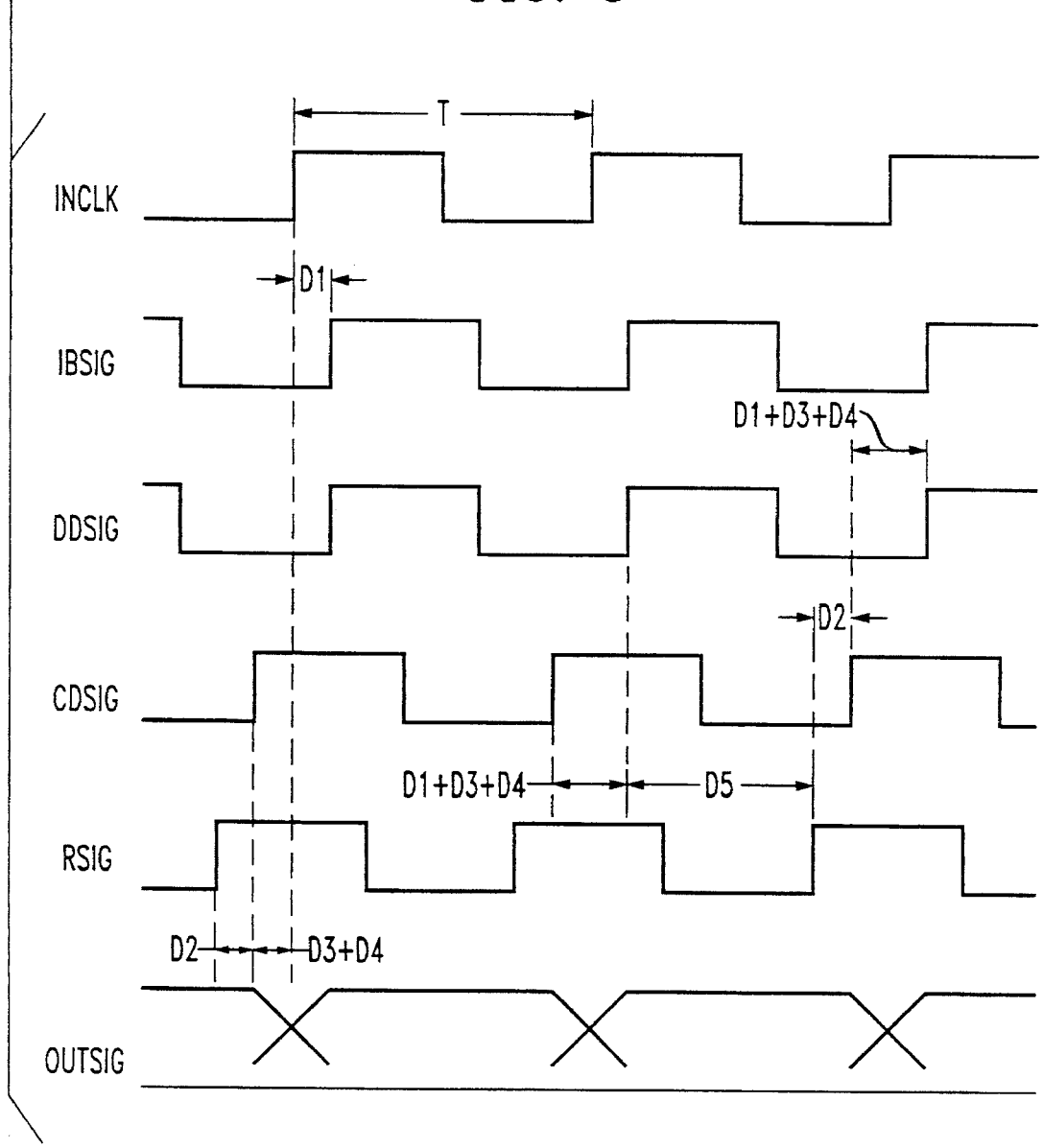
FIG. 3 illustrates exemplary signals present in the de-skewing circuit of FIG. 2.

With continued reference to FIG. 2, de-skewing circuit 100 preferably includes a phase detector 130 coupled to an input buffer 120 which receives the docked input signal INCLK and outputs a buffered input signal IBSIG. In particular, input buffer 120 is preferably operative as an isolating circuit which is used to prevent a driven circuit from influencing a driving circuit. Ideally, such an input buffer 120 should not introduce any propagation time delay (skew) onto a signal passing therethrough, however, in commercial applications the input buffer 120 will inherently skew the input signal passing therethrough. The amount of signal delay effected by input buffer 120 varies from device to device due to process, power supply, and temperature variations. The signal delay introduced to the input signal INCLK by input buffer 120 is hereinafter referred to as $D_1$ delay (which is included onto the output signal IBSIG of the input buffer 120). Reference shall now also be made to FIG. 3, in conjunction with FIG. 2 which illustrates exemplary signals of the de-skewing circuit 100.

Coupled to the output signal IBSIG of input buffer 120 is a phase detector 130 and regulated delay circuit 140. The functionality of the phase detector 130 and regulated delay circuit 140 will be described further below. Coupled to the output signal RSIG of the regulated delay circuit 140 is a clock driver 150 which is operative in IC1 to drive the RSIG signal to a plurality of logic devices which are illustrated as Flip-Flop 1 through Flip Flop N in FIG. 2. It is to be appreciated that such logic devices are not intended to be limited to Flip Flop 1 through Flip Flop N but rather may encompass any known type of logic device requiring a clocked reference signal (CDSIG signal). A variety of clock driver circuits 150 are well known in the art, and clock driver 150 may utilize any suitable driver circuit known in the art in the presently preferred embodiment of the present invention. Further, clock driver 150 outputs the driven CDSIG signal, and due to logic operation being performed therein, introduces a signal delay D: to the output CDSIG signal. As with the aforementioned $D_1$ signal delay associated with input buffer 120, signal delay $D_2$ of the clock driver 150 varies from device to device due to process, power supply, and temperature variations.

Coupled to the output data signal OUTSIG of IC1 is an output latch 160 and an output buffer 170 in series with one another. Briefly, as it is well known, output latch 160 in its most basic configuration is a simple logic storage element which consists of two cross-coupled logic gates that store a pulse applied to one logic input until a pulse is applied to the other input (i.e., a D-type flip-flip). Therefore, output latch 160 has two inputs, wherein its first input receives the clock reference signal CDSIG from the clock driver 150 and the second input receives a data signal ALSIG from an asynchronous logic device 180 (e.g., a multiplexer) which receives its input signals FFSIG1 through FFSIGN respectively from Flip Flop 1 through Flip Flop N. In particular, Flip Flop 1 through Flip Flop N are each respectively coupled to the driven clock output signal CDSIG of clock driver 150. Further, DATASIG1 is received by FLIP FLOP 1, via another IC associated with system 10 (FIG. 1) as the input data signal, while the dam input signal to FLIP FLOP 2 through FLIP FLOP N is respectively DATASIG2 thru DATASIGN provided by the asynchronous logic device 180.

Output buffer 170 is preferably an isolating circuit employed to isolate IC1 from the load requirements of the OUTSIG data signal. The circuitry of output latch 160 and output buffer 170 are well known in the art and will not be described in detail hereinafter. It shall also be noted that both the output buffer 170 and output latch 160 may respectively utilize any suitable circuitry known in the art in the presently preferred embodiment of the present invention.

Due to their respective logic operations, output latch 160 and output buffer 170 both respectively introduce a signal delay to the OUTSIG data signal. As with the input buffer 120 and clock driver 150, the respective signal delays of the output latch 160 and output buffer 170 vary from device to device due to process, power supply, and temperature variations. The respective signal delays introduced to the OUTSIG data signal by output latch 160 and output buffer 170 are hereinafter referred to as the $D_3$, and $D_4$, delays. Therefore, the combined signal delays $(D_1+D_2+D_3+D_4)$ of the output OUTSIG data signal effected respectively by input buffer 120, clock driver 130, output latch 160 and output buffer 170, left uncorrected in each IC1 through ICN, creates a deleterious effect with respect for the efficiency of the multi-chip integrated circuit system implemented upon the circuit board 10.

To obviate the aforementioned deleterious effects of signal skewing caused by the aforementioned signal delays $D_1$, $D_2$, $D_3$, and $D_4$, the de-skewing circuit 100 of the present invention is configured to compensate the output data signal OUTSIG with a controllable signal delay $D_5$ so as to synchronize the output OUTSIG data signal with the input clock reference signal INCLK. To achieve the aforementioned synchronization, the de-skewing circuit 100 includes a dummy delay buffer 190 coupled in a feedback loop which is configured to assume the identical signal delays $D_1$, $D_3$, and $D_4$ respectively associated with the input buffer 120, output latch 160 and output buffer 170. Dummy delay buffer 190 is manufactured in the same manner and at the same area on IC1 as input buffer 120, output latch 160 and output buffer 170. Therefore, the dummy delay buffer 190 generates the same signal delays $D_1$, $D_3$, and $D_4$ of the later components and introduces this combined signal delay ($D_1+D_3+D_4$) to the output signal DDSIG of the dummy delay circuit 40.

Further, as mentioned above, the de-skewing circuit 100 includes the phase detector 130 coupled to the regulated delay circuit 140. In particular, the phase detector 130 has a first input coupled to the output signal IBSIG of the input buffer 120, and a second input coupled to the output signal DDSIG of the dummy delay buffer 190. The phase detector 130 is operative to compare the phase of the input signal IBSIG to the phase of the output signal DDSIG of the dummy delay buffer 190.

The output of the phase detector 130, provides a control signal FAST/SLOW which is dependent upon the measured phase difference between the output signal IBSIG of the input buffer 120 and the output signal DDSIG of the dummy delay buffer 190. The FAST/SLOW signal is operative to determine whether a regulated delay placed upon the output signal IBSIG of the input buffer 120 by regulated delay circuit 140 is to be either increased or decreased. Therefore, regulated delay circuit 140 is operative to generate a controllable signal delay $D_5$ to the IBSIG signal received from the output of input buffer 120. The controllable signal delay $D_5$ equals $T-(D_1+D_2+D_3+D_4)$ when IBSIG is in synchronization with DDSIG. The regulated delay circuit 140 is then configured to output a signal RSIG having delay $D_5$ ($T-(D_1+D_2+D_3+D_4)$). The circuitry of the phase detector 130 and regulated delay circuit 140 are well known in the art and will not be described in detail hereinafter. It shall also be noted that the phase detector 130 and regulated delay circuit 140 may utilize any suitable circuitry known in the art in the presently preferred embodiment of the present invention. The respective operations of the phase detector 130 and regulated delay circuit 140 for providing the controllable signal delay $D_5$ will be described in more detail below.

As mentioned above, it is desirable that the output data signal OUTSIG of output latch 160 have equal edge transitions which are substantially equal in time with the edge transitions of the clocked input reference signal INCLK. It is therefore necessary for the de-skewing circuit 100 of the present invention to compensate for the aforementioned signal delays ($D_1$ through $D_4$) introduced to the OUTSIG data signal which occur from input buffer 120 through output buffer 170. Further, the total signal delay D of the OUTSIG dam signal to the INCLK signal equals:

$$D=D_1+D_2+D_3+D_4+D_5$$

wherein $D_1$ is the buffer delay of input buffer 120, $D_2$ is the signal delay of the clock driver 150, $D_3$ is the signal delay of the output latch 160, $D_4$ is the buffer delay of the output buffer 170 and $D_5$ is the controllable delay of the regulated delay circuit 140.

As aforementioned, the $D_5$ signal delay of the regulated delay circuit 140 is the only adjustable signal delay in the de-skewing circuit 100. To enable the OUTSIG data signal to be synchronous with the INCLK signal, the total delay D from input buffer 120 through output buffer 170 should be equal to either zero or the entire phase T of the INCLK signal. In the presently preferred embodiment, the $D_5$ signal delay of the regulated delay circuit 140 is controlled by the phase detector 130, via the FAST/SLOW signal, such that the total delay D from input buffer 120 through output buffer 170 is to be equal to the period T of the input signal INCLK.

In order to control the $D_5$ signal delay of the regulated delay circuit 140, a feedback loop is provided in the de-skewing circuit 100. As aforementioned, the feedback loop includes clock driver 150 coupled to the output signal RSIG of regulated delay circuit 140, which in turn is coupled to the dummy delay buffer 190. The dummy delay buffer 190 receives the CDSIG signal from clock driver 150 and couples its output signal DDSIG to phase detector 130. Controlled by the DDSIG signal, the phase detector 130 is operative to output the FAST/SLOW signal to the regulated delay circuit 140, which in turn is operative to generate the controllable $D_5$ signal delay to the RSIG signal, such that the total delay D of the OUTSIG data signal is equal (has identical edge transitions) to the period T of the INCLK signal. Therefore, the OUTSIG data signal is maintained in synchronization with the INCLK signal.

While the invention has been particularly shown and described with reference to certain preferred embodiments, it will be understood by those skilled in the art that various modifications in form and detail may be made therein without departing from the scope and spirit of the invention. Accordingly, modification to the preferred embodiments will be readily apparent to those skilled in the art, and the generic principles defined herein may be applied to other embodiments or applications without departing from the spirit and scope of the invention.

What is claimed is:

1. An integrated circuit having circuitry to compensate for signal delays therein, said integrated circuit comprises:

a) a first input buffering means for receiving and buffering a clocked input reference signal, wherein said input buffer means generates a first signal delay upon said input reference signal;

b) signal regulating means coupled to said input buffering means for generating a synchronizing signal delay to said input reference signal for synchronizing an output data signal with said input reference signal, said signal regulating means having an output port and at least one input port and a feedback loop coupling said output port to said at least one input port;

c) a first output latching means coupled to said output port of said signal regulating means at a first input of said output latching means for latching said output data signal, wherein said output latching means generates a second signal delay upon said output data signal;

d) a first output buffering means coupled to said output latching means for buffering said output data signal, wherein said output buffering means generates a third signal delay upon said output data signal; and simulated signal delay means coupled in said feedback loop for generating a delayed input signal to said signal regulating means, said delayed input signal having a generated simulated signal delay approximately equal to said first signal delay of said input buffering means, said second signal delay of said output latching means and said third signal delay of said output buffering means, wherein said delayed input signal is operative to enable said signal regulating means to provide a signal delay to said input reference signal so as to synchronize said input reference signal with said output data signal.

2. An integrated circuit as recited in claim 1, wherein said simulated signal delay means includes a second input buffering means, a second output latching means and a second output buffering means.

3. An integrated circuit as recited in claim 2, wherein said signal regulating means includes:
   (i) phase detecting means for measuring the respective signal phases between an output signal of said input buffering means and said delayed input signal of said simulated signal delay means; and
   (ii) regulated delay means coupled to said phase detecting means for generating said synchronizing signal delay responsive to the measured signal phase difference between said output signal of said input buffering means and said delayed input signal of said simulated signal delay means.

4. An integrated circuit as recited in claim 1, further including:
   g) an asynchronous logic device coupled to a second input of said output latching means for providing a data input signal to said output latching means.

5. An integrated circuit as recited in claim 4, further including:
   h) a plurality of synchronous logic devices coupled to a corresponding plurality of inputs of said asynchronous logic device for providing dam input to said asynchronous logic device.

6. An integrated circuit as recited in claim 5, further including:
   (i) clock driving means coupled to said regulating means for driving said input reference signal to said plurality of synchronous logic devices.

7. An integrated circuit as recited in claim 6, wherein each of said plurality of synchronous logic devices is a flip-flop device.

8. A circuit board having a plurality of integrated circuits provided thereon, wherein each of said plurality of integrated circuits receives a common clock input reference signal and provides an output data signal therefrom, and includes compensating circuitry for synchronizing said output data signal with said input reference signal, said compensating circuitry comprises:
   a) a first input buffering means for receiving and buffering said common clock input reference signal, wherein said input buffer means generates a first signal delay upon said input reference signal;
   b) signal regulating means coupled to said input buffering means for providing a synchronizing signal delay to said input reference signal for synchronizing said output signal with said input reference signal, said signal regulating means having an output port and at least one input port and a feedback loop coupling said output port to said at least one input port;
   c) clock driving means coupled to said signal regulating means for driving said input reference signal to a plurality of logic devices;
   d) a first output latching means coupled to said clock driving means at a first input of said output latching means for latching said output signal, wherein said output latching means generates a second signal delay upon said output signal;
   e) a first output buffering means coupled to said output latching means for buffering said output data signal, wherein said output buffering means generates a third signal delay upon said output data signal;
   f) asynchronous logic means coupled to a second input of said output latch for providing a data input thereto, wherein said asynchronous logic means has a plurality of inputs respectively coupled to said plurality of logic devices; and
   g) simulated signal delay means coupled in said feedback loop for generating a delayed input signal to said signal regulating means, said delayed input signal having a generated simulated signal delay approximately equal to said first signal delay of said input buffering means, said second signal delay of said output latching means and said third signal delay of said buffering means, wherein said delayed input signal of operative to enable said signal regulating means to provide a signal delay to said input reference signal so as to synchronize said input reference signal with said output dam signal.

9. A circuit board as recited in claim 8, wherein said simulated signal delay means includes a second input buffering means, a second output latching means and a second output buffering means.

10. A circuit board as recited in claim 8, wherein said signal regulating means includes:
    (i) phase detecting means for measuring the respective signal phases between an output signal of said input buffering means and said delayed input signal of said simulated signal delay means; and
    (ii) regulated delay means coupled to said phase detecting means for generating said synchronizing signal delay responsive to the measured signal phase difference between said output signal of said input buffering means and said delayed input signal of said simulated signal delay means.

11. A circuit board as recited in claim 10, wherein each of said plurality of logic devices is a flip-flop device.

12. A method of maintaining signal synchronization in an integrated circuit comprising the steps of:
    a) buffering a clock input reference signal;
    b) latching an output dam signal in reference to said input reference signal;
    c) buffering said output dam signal;
    d) generating a signal delay approximately equal to signal delays associated with said buffered input signal, said latched output data signal and said buffered output data signal;
    e) applying said generated signal delay to said input reference signal;
    f) detecting the phase difference between said input reference signal and said input reference signal having said generated signal delay; and
    g) selecting a signal delay for said output data signal which maintains said output data signal in synchronization with said input reference signal.

13. A method of maintaining signal synchronization in an integrated circuit as recited in claim 12, further including the steps of:
    h) driving said input reference signal to a plurality of logic devices;
    i) inputting a plurality of data signals to said plurality of logic devices; and
    j) inputting a plurality of data signals from said plurality of logic devices to an asynchronous logic device; and
    k) latching said output data signal with a data signal from said asynchronous logic device in reference to said input reference signal.

* * * * *